United States Patent [19]

Furuyama

[11] Patent Number: 5,369,612
[45] Date of Patent: Nov. 29, 1994

[54] SEMICONDUCTOR MEMORY DEVICE

[75] Inventor: Tohru Furuyama, Tokyo, Japan

[73] Assignee: Kabushiki Kaisha Toshiba, Kawasaki, Japan

[21] Appl. No.: 172,742

[22] Filed: Dec. 27, 1993

Related U.S. Application Data

[63] Continuation of Ser. No. 721,255, Jun. 26, 1991, abandoned.

[30] Foreign Application Priority Data

Jun. 27, 1990 [JP]  Japan .................................. 2-166914
Feb. 13, 1991 [JP]  Japan .................................. 3-41316

[51] Int. Cl.$^5$ ............................................. G11C 7/02
[52] U.S. Cl. ........................... 365/189.05; 365/189.12
[58] Field of Search ............. 365/149, 189.05, 189.12, 365/203, 240

[56] References Cited

U.S. PATENT DOCUMENTS

| | | | |
|---|---|---|---|
| 3,763,480 | 10/1973 | Weimer | 340/173 R |
| 4,070,590 | 1/1978 | Ieda et al. | 307/355 |
| 4,225,945 | 9/1980 | Kuo | 365/149 |
| 4,583,382 | 6/1986 | Fijishima et al. | 365/149 |
| 4,648,073 | 3/1987 | Kenney | 365/149 |
| 4,669,063 | 5/1987 | Kirsch | 365/189 |
| 4,683,555 | 7/1987 | Pinkham | 365/189.12 X |
| 4,758,987 | 7/1988 | Sakui | 365/189 |
| 4,943,944 | 7/1990 | Sakui et al. | 365/189.05 |
| 4,980,863 | 12/1990 | Ogihara | 365/205 |
| 5,025,294 | 6/1991 | Ema | 357/23.6 |
| 5,051,954 | 9/1991 | Toda et al. | 365/189.02 |
| 5,079,746 | 1/1992 | Sato | 365/225.7 |
| 5,091,761 | 2/1992 | Hiraiwa et al. | 357/23.6 |
| 5,091,885 | 2/1992 | Ohsawa | 365/203 |
| 5,172,198 | 12/1992 | Aritome et al. | 257/315 |
| 5,184,326 | 2/1993 | Hoffman et al. | 365/201 |

FOREIGN PATENT DOCUMENTS

| | | |
|---|---|---|
| 0157051 | 10/1985 | European Pat. Off. . |
| 0273639 | 7/1988 | European Pat. Off. . |
| 0365720 | 5/1990 | European Pat. Off. . |
| 0398244 | 11/1990 | European Pat. Off. . |
| 0499224 | 8/1992 | European Pat. Off. . |
| 1922761 | 2/1970 | Germany . |
| 4015472 | 11/1990 | Germany . |
| 1-134796 | 5/1989 | Japan . |
| 4-212780 | 8/1992 | Japan . |

OTHER PUBLICATIONS

Kimura et al., "A Block-Oriented RAM with Half-Sized DRAM Cell and Quasi-Folded Data-line Architecuture", ISCC 91, Slide Supplement, pp. 70-71 Feb. 1991.

Arimoto et al., "A Circuit Design of Intelligent CDRAM with Automatic Write back Capability", 1990 Symposium on VLSI Circuits, Digest of Technical Papers, pp. 79-80.

Shah et al., "A 4Mb DRAM with Cross-point Trench Transistor Cell", 1986 ISSCC Digest of Technical Papers, pp. 268-269.

Ema et al., "3-Dimensional Stacked Capacitor Cell for 16M and 64M DRAMs", 1988 IEDM Technical Digest, pp. 592-595.

Watanabe et al., "Stacked Capacitor Cells for High-density Dynamic RAMs", 1988 IEDM Technical Digest, pp. 600-603.

Sunouchi et al., "A Surrounding Gate Transistor (SGT) Cell for 74/256 MBit DRAMs", 1989 IEDM Technical Digest, pp. 23-26.

Fujishima et al., "A Storage-Node-Boosted RAM with Word-Line Delay Compensation", IEEE Jouranl of (List continued on next page.)

Primary Examiner—Steven Mottola

[57] ABSTRACT

A semiconductor memory device comprising a memory cell array having a plurality of dynamic memory cells, each of the memory cells including a plurality of MOS transistors connected by cascade connection, capacitors for storing data each having an end connected to an end of a corresponding one of the MOS transistors, and a register arranged in a column portion of the memory cell array, for temporarily registering the data read from the memory cells in a time series manner.

5 Claims, 14 Drawing Sheets

OTHER PUBLICATIONS

Solid State Circuits, vol. SC-17, No. 5, pp. 872-875, Oct. 1982.

Ohta et al., "A Novel Memory Cell Architecture for High-Density DRAMs", 1989 Symposium of VLSI Circuits, Digest of Tech. Papers, pp. 101-102.

Ohta et al., "Quadruply Self-Aligned Stacked High-Capacitance RAM Using $Ta_2O_5$ High Density VLSI Dynamic Memory", IEEE Transactionss on Electron Devices, vol. ED-29, No. 3, Mar. 1982, pp. 368-376.

Kimura, et al., "A Block-Oriented RAM with Half-Sized DRAM Cell and Quasi-Folded Data-Line Architecture," ISSCC 91, pp. 106-107, Feb. 14, 1991.

Asakura et al., "Cell-Plate Line Connecting Complementary Bitline (C°) Architecture for Battery Operating DRAMs", 1991 Symposium on VLSI Circuits, May 30, 1991, pp. 59-60.

Ohta, et al., "A Novel Memory Cell Architecture for High Density DRAMs", Sharp Technical Journal, vol. 44, Mar. 1990, Japan, pp. 47-50.

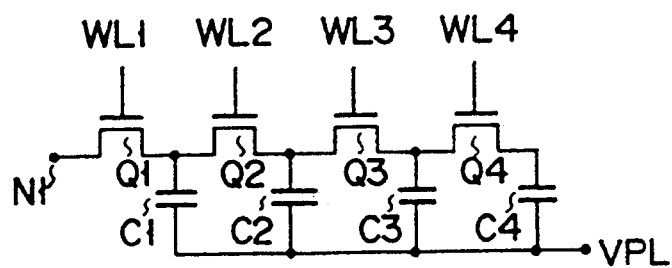
F I G. 1
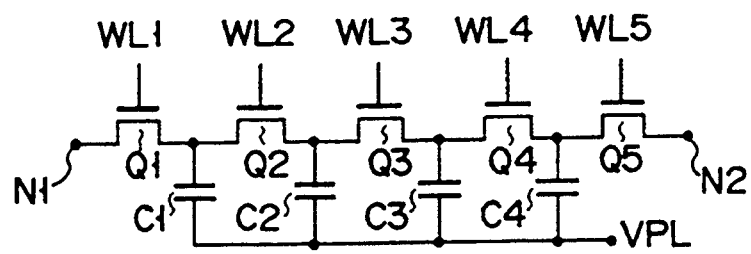
F I G. 2

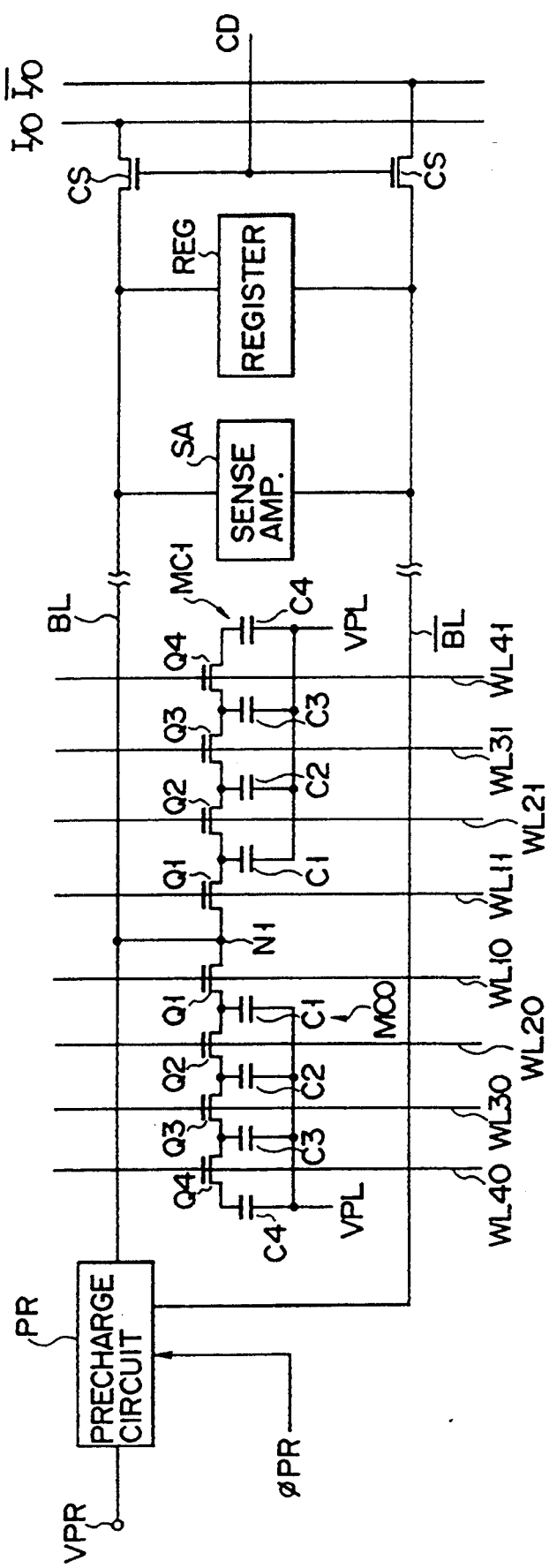
F I G. 3

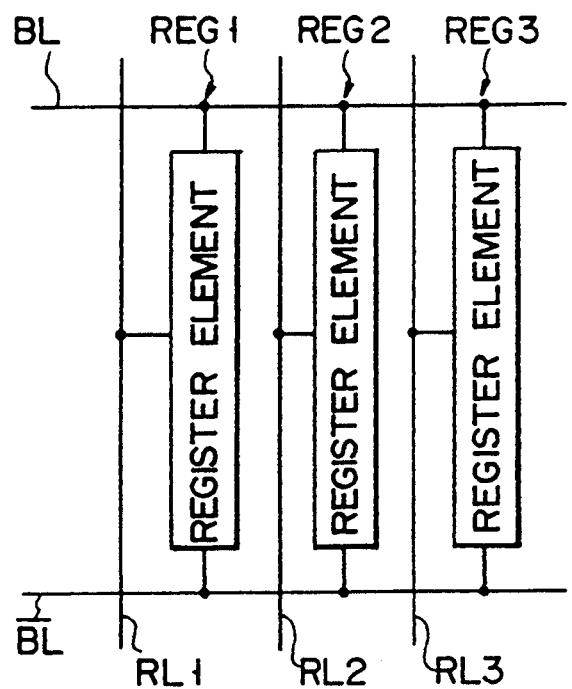
F I G. 6
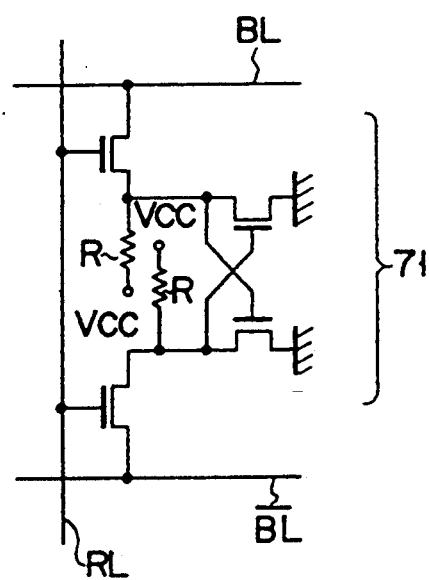
F I G. 7

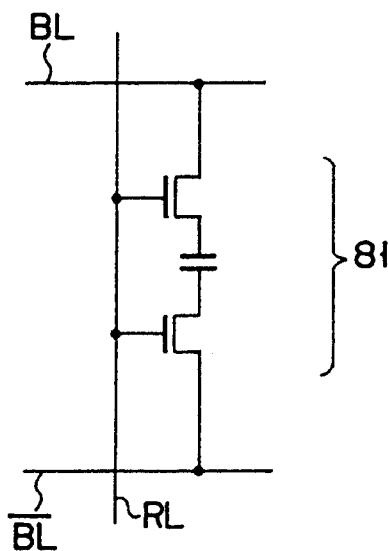
F I G. 8
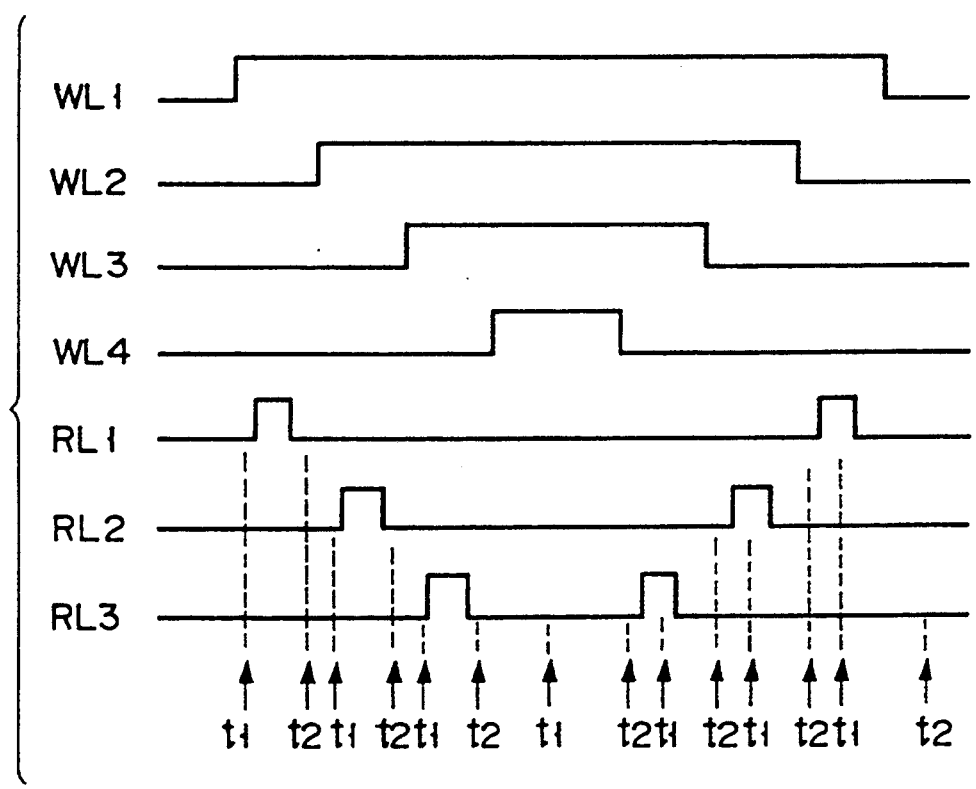
F I G. 9

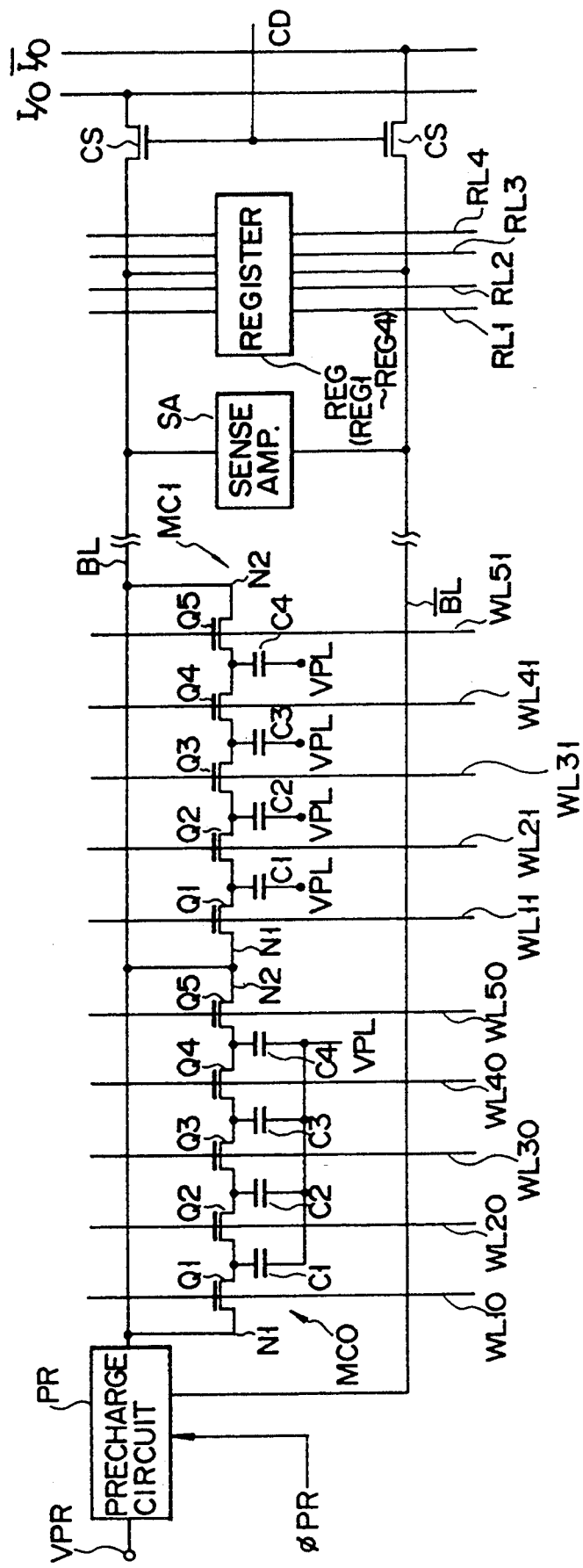
F I G. 10

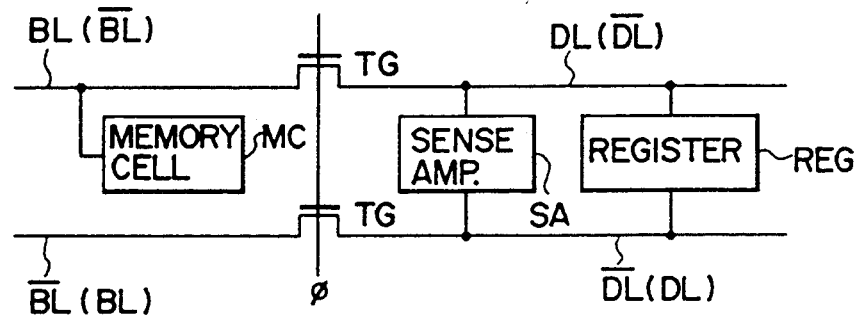
F I G. 15
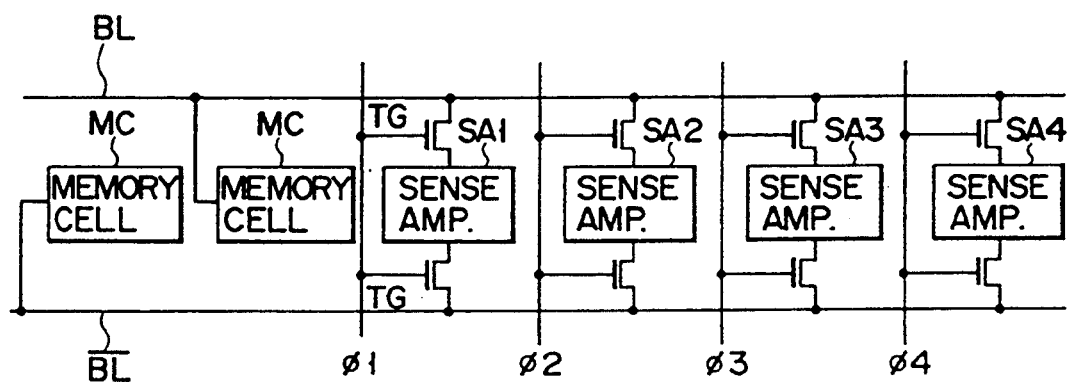
F I G. 16

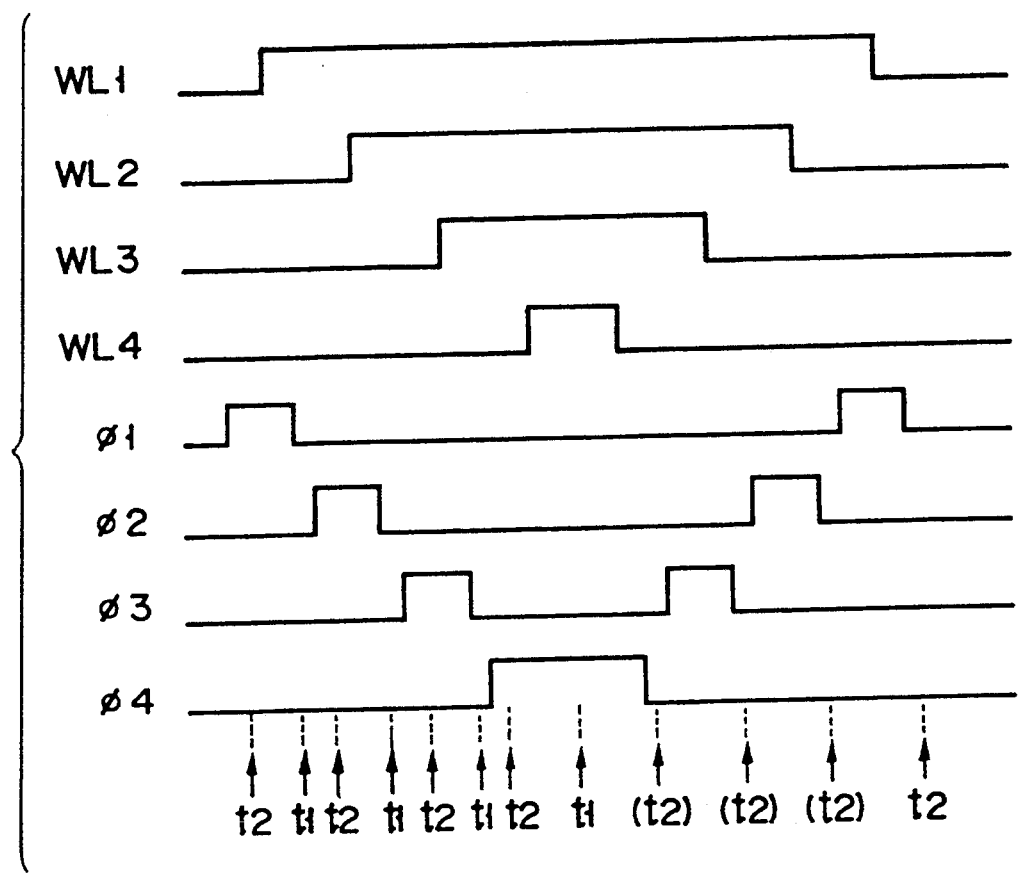
F I G. 17

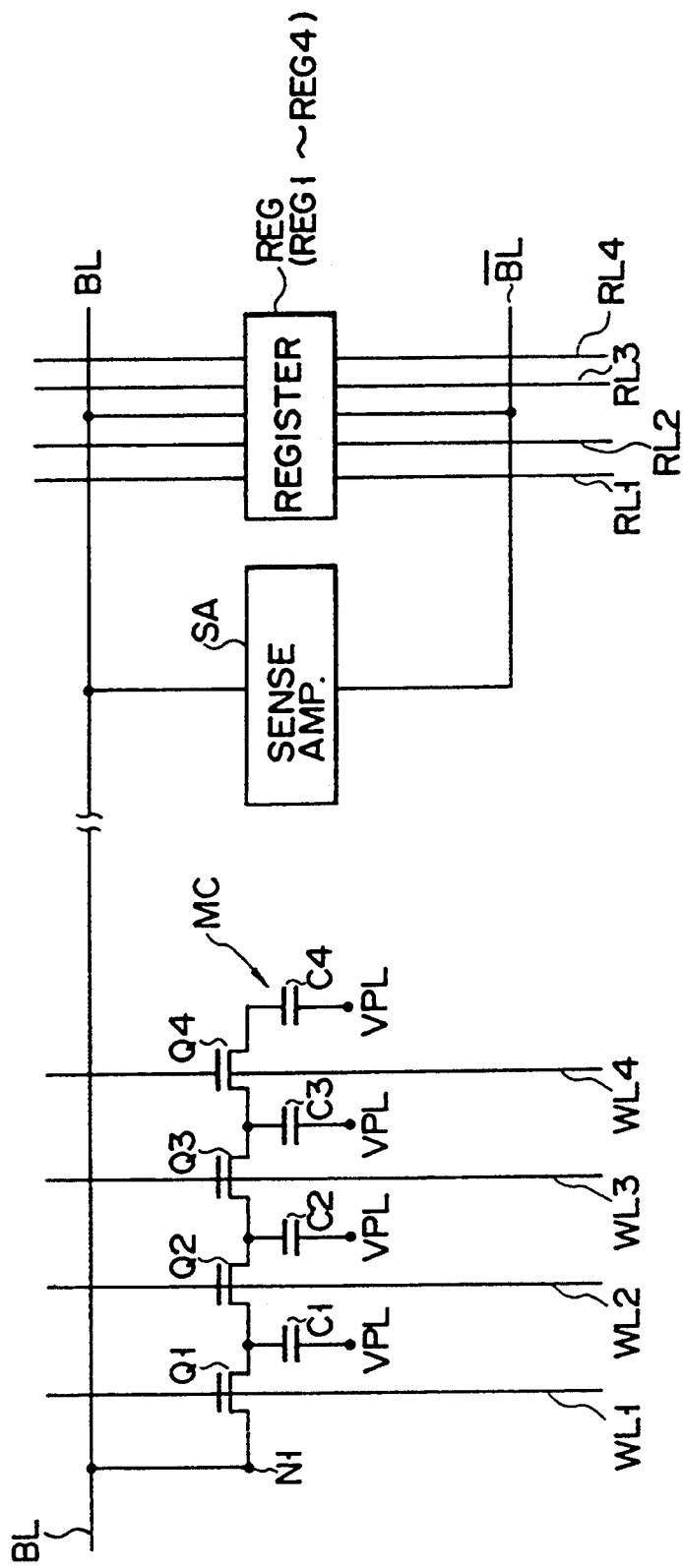
F I G. 20

SEMICONDUCTOR MEMORY DEVICE

This application is a continuation, of application Ser. No. 07/721,255, filed Jun. 26, 1991, now abandoned.

BACKGROUND OF THE INVENTION

1. Field of the Invention

This invention relates to a semiconductor memory device, and more particularly to a dynamic random access memory (DRAM).

2. Description of the Related Art

Most DRAM cells put in practice in these days each comprise an (insulating gate type) MOS transistor serving as a transfer gate and connected to a word line and to a bit line, and a capacitor connected to the MOS transistor for storing data.

To more highly integrate DRAM cells to thereby reduce the cost of each bit, the inventor of the invention has proposed, in U.S. application Ser. No. 6 8 7, 6 8 7, cascade gate type semiconductor memory cells shown in FIGS. 1 and 2.

The DRAM cell shown in FIG. 1 comprises MOS transistors Q1-Q4 connected by cascade connection, and capacitors C1-C4 each having one end connected to one end of the corresponding transistor Q1-Q4, for storing data. By turning on and off the transistors Q1-Q4 in a predetermined order, data items are successively read to a read-out/write-in node 1 which is connected to a bit line BL from the capacitors C1, C2, C3, and C4 in the order mentioned, i.e., in the order from the capacitor closest to the bit line BL to that remotest therefrom. Similarly, the read-out write-in data items are written from the node 1 into the capacitors C4, C3, C2, and C1 in the order mentioned, i.e., in the order of from the capacitor remotest from the bit line BL to that closest thereto.

The DRAM cell shown in FIG. 2 is similar to that shown in FIG. 1 except that it further incorporates a second node N2 and a MOS transistor Q5 connected between the transistor Q4 and the second node N2. Also in the DRAM cell of FIG. 2, by turning on and off the transistors Q1-Q5 in a predetermined order, data items are successively read to the node 1 from the capacitors C1, C2, C3, and C4 in the order mentioned, and the read-out/ write-in data items are written from the node 2 into the capacitors C1, C2, C3, and C4 in the order mentioned.

The above-described cascade gate type memory cells shown in FIGS. 1 and 2 can store data of a plurality of bits in units of one bit. Thus, as compared with a conventional DRAM consisting of an array of cells each having a transistor and a capacitor, a remarkably highly integrated DRAM can be formed of an array of memory cells of the cascade gate type, thereby much reducing the cost of one cell or bit, since only one contact is required in the latter case to connect a plurality of cells or bits to a bit line.

In the DRAM made of cascade gate type memory cells, however, data stored in each cell is read out in a destructive read out manner, so that it is always needed to rewrite data into the cell. But, rewriting new data into any capacitor cannot be performed immediately after the stored data is read out, since in any memory cell of the cascade gate type, the order of the capacitors from which the stored data is read out is predetermined. That is, rewriting can be performed for the first time after data stored in all the capacitors are read out completely.

Thus, the DRAM comprising of a cascade gate type memory cell array must have means for rewriting (or writing) data in order into the capacitors employed in each cell, after data of a plurality of bits are read out of the cell.

SUMMARY OF THE INVENTION

This invention has been made in consideration of the above-described circumstances, and therefore has the object to provide a semiconductor memory device consisting of a high density and hence low-bit-cost DRAM including a cascade gate type memory cell array, in which a plurality of data items are read from a memory cell in a time series manner, and then successively be rewritten (or written) into the memory cell.

To attain the object, the memory device of the invention comprises a memory cell array having a plurality of dynamic memory cells, each of the memory cells including a plurality of MOS transistors connected by cascade connection, capacitors for storing data each having an end connected to an end of a corresponding one of the MOS transistors; and register means arranged in the column portion of the memory cell array, for temporarily registering the data read from the memory cells in a time series manner.

By virtue of the above structure, the semiconductor memory device of the invention can successively read data items from the capacitors of a memory cell to its bit line, then register them in register means, and successively write data items from the bit line into the capacitors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a cascade gate type memory cell which has been proposed;

FIG. 2 is a circuit diagram showing another cascade gate type memory cell which has also been proposed;

FIG. 3 is a circuit diagram showing a part of a DRAM of a first embodiment of the invention;

FIG. 6 is a circuit diagram showing a further example of elements forming the register shown in FIG. 3;

FIG. 7 is a circuit diagram showing an example of elements shown in FIG. 6;

FIG. 8 is a circuit diagram showing another example of elements shown in FIG. 6;

FIG. 9 is a waveform timing chart illustrating the operation of the DRAM shown in FIG. 3;

FIG. 10 is a circuit diagram showing a part of a DRAM of a second embodiment of the invention;

FIG. 15 is a circuit diagram showing a part of a DRAM of a fourth embodiment of the invention;

FIG. 16 is a circuit diagram showing a part of a DRAM of a fifth embodiment of the invention;

FIG. 17 is a waveform timing chart showing the operation of the DRAM shown in FIG. 16;

FIG. 20 is a diagram showing a circuit similar to that shown in FIG. 3, except that it incorporates a single end type sense amplifier in place of the sense amplifier shown in FIG. 3;

DETAILED DESCRIPTION OF THE PREFERRED EMBODIMENTS

Figure 4:
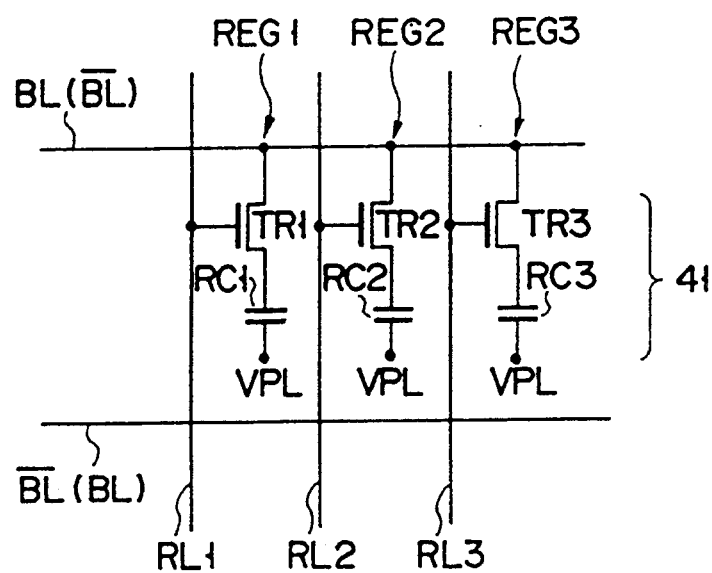
FIG. 4 is a circuit diagram showing an example of elements forming a register shown in FIG. 3.

The invention will now be explained in detail with reference to the accompanying drawings showing embodiments thereof. In the figures, like reference numerals designate like components, and overlapping explanations are avoided.

FIG. 3 shows one-column portion of a memory cell array of a DRAM according to a first embodiment of the invention. This memory cell array consists of a plurality of cascade gate type memory cells as shown in FIG. 1, only two of which are shown as memory cells MC0 and MC1, for simplifying the explanation of the array. Reference symbols BL, $\overline{BL}$ designate complementary bit lines, reference symbols WL10-WL40 and WL11-WL41 word lines to be driven by a word line driving circuit (not shown), reference symbol SA a bit line sense amplifier (e.g. a latch type amplifier) for sensing the potentials of the bit lines, reference symbol REG a register for temporarily registering bit data read from a selected memory cell in a time series manner, reference symbol PR a bit line precharging circuit to be driven by a bit line precharging signal $\Phi$ PR, reference symbol VPR a bit line precharging source, reference symbol CS a column selecting switch to be controlled by an output CD generated from a column decoder circuit (not shown), and reference symbols I/O, $\overline{I/O}$ complementary input/output lines.

The above-described memory cells MCi (i=0, 1, ...) each comprise a cascade gate having a plurality of MOS transistors, four transistors Q1-Q4 in this embodiment, which are connected by cascade connection, and a plurality of capacitors C1-C4 (corresponding in number to the transistors Q1-Q4) for storing a plurality of data, connected to those ends of the transistors which are located remote from a node N1, respectively. That end of the cascade gate which is located close to the node N1 is connected to the bit line BL. The capacitors C1-C4 have the other ends connected to a capacitor common line. In this embodiment, one common plate electrode is provided for the capacitors C1-C4, to supply them with a predetermined capacitor plate potential VPL.

The transistors Q1-Q4 of the memory cell MC0 have their gates connected to the word lines WL10-WL40, respectively. The word lines WL10-WL40 are also connected to the gates of transistors Q1-Q4 of each of memory cells (not shown) arranged in the same row as the memory cell MC0. Similarly, the transistors Q1-Q4 of the memory cell MC1 have their gates connected to the word lines WL11-WL41, respectively. The word lines WL11-WL41 are also connected to the gates of transistors Q1-Q4 of each of memory cells (not shown) arranged in the same row as the memory cell MC1.

The register REG has register elements of a number equal to or smaller by 1 than the capacitor number (=bit number) of the memory cell MCi.

Figure 5:
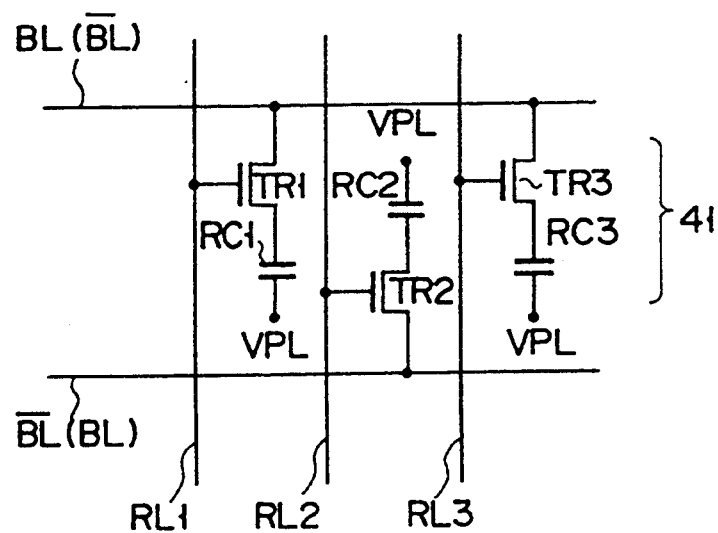
FIG. 5 is a circuit diagram showing another example of elements forming the register shown in FIG. 3.

FIGS. 4, 5, and 6 show cases where the number of the elements of the register REG is smaller by 1 than that of the capacitors of the memory cell MCi, i.e., the number of the elements is three.

Referring to FIG. 4, reference symbols REG-1–REG3 denote first—third elements each consisting of a dynamic memory cell 41 having a transistor and a capacitor, respectively. Transistors TR1-TR3 of the elements have ends connected to the bit line BL (or $\overline{BL}$), and gates connected to control signal lines RL1-RL3, respectively. Capacitors RC1-RC3 of the elements are connected to e.g. the same capacitor plate having a potential VPL.

The register shown in FIG. 5 differs from the register shown in FIG. 4 in that for example, the transistors TR1 and TR3 of the first and third elements REG 1 and REG 3 have ends connected to the bit line BL (or $\overline{BL}$), and the transistor TR2 of the remaining or second element REG2 has an end connected to the other bit line $\overline{BL}$ (or BL).

Referring to the register shown in FIG. 6, the elements REG1-REG3 are each connected to both the bit lines BL and $\overline{BL}$, and also to the control signal lines RL1-RL3, respectively.

FIGS. 7 and 8 illustrates examples of the register elements REG1-REG3 in FIG. 6.

The register element of FIG. 7 comprises a static memory cell (SRAM) 71 having a flip-flop circuit having a resistor R and two transfer gates. In this case, a P-channel MOS transistor may be used in place of the resistor R.

The register element of FIG. 8 comprises a dynamic memory cell 81 having two transistors and a capacitor connected between the transistors. This type memory cell is disclosed in "A Novel Memory Cell Architecture for High-Density DRAMs" by Y. Ohta, et al., 1989 Symposium on VLSI Circuits, Digest of Technical Papers, pp. 101-102, May 1989.

FIG. 9 is a waveform timing chart showing the operations of the sense amplifier SA, register REG, and word lines WL1-WL4, which are connected to one memory cell MCi, in the case of using three register elements for the register in FIG. 3.

As is shown in FIG. 9, the word lines WL1-WL4 are turned on in the order of WL1, WL2, WL3, and WL4, and off in the reverse order. Further, control signal lines RL1-RL3 are turned on and off at points of time as shown, thereby operating the register elements in the order of first, second, and third, and then operating them in the reverse order. In the figure, point t1 denotes the time when the sense amplifier SA is operated, while point t2 denotes the time when the bit lines BL and $\overline{BL}$ are precharged to a predetermined potential (e.g. a half of the power source voltage).

By virtue of the above-described control, data items are successively read to the bit line BL from the capacitors C1, C2, C3, and C4 in the order mentioned, i.e., in the order from the capacitor closest to the bit line BL to that remotest therefrom. The data read out of the capacitors C1-C3 are successively registered in the register REG. In this state, the read-out data or new data can be written into the capacitors C4, C3, C2, and C1 in the order mentioned, i.e., in the order of from the capacitor remotest from the bit line BL to that closest thereto.

Thus, 4-bit digital data stored in the capacitors C1-C4 can be read out of the DRAM chip in a predetermined order, upon turning on the word lines WL1-WL4 and operating the sense amplifier SA.

The above-described operation will be explained in more detail. When the word line WL1 is turned on after the bit lines BL and $\overline{BL}$ are precharged to the predetermined potential VPR by the bit line precharging circuit PR at the time point t1, the transistor Q1 is turned on, and the data in the capacitor C1 is read out through the transistor Q1. The read-out data is amplified by the sense amplifier SA. Then, the control signal line RL1 is turned on, and kept on until the amplified data is registered in the first element REG1 of the register REG. After the line RL1 is turned off, the bit lines BL and $\overline{BL}$ are precharged again at the time point t2. Then, the word line WL2 is turned on in a state in which the word line WL1 is on. At this time, the transistor Q2 is turned on, and the data stored in the capacitor C2 is read to the bit line BL through the transistors Q2 and Q1, where the sense amplifier SA is operated at the time point t1, thereby sensing the read-out data. Subsequently, the control signal line RL2 is turned on, and is kept on until the data read out of the capacitor C2 is amplified and then registered in the second element REG 2 of the register REG. In a similar way, the data stored in the capacitor C3 is registered in the third element REG 3 of the register REG. The bit lines BL and $\overline{BL}$ are again precharged at the time point t2, and the word line WL4 is turned on, thereby turning on the transistor Q4 and reading data from the capacitor C4 to the bit line BL through the transistors Q4-Q1. The sense amplifier SA is operated at the time point t1, and senses the read-out data. Since at this time, the bit line BL is set at a rewriting potential corresponding to the data read out of the capacitor C4, rewriting is performed in the capacitor C4 upon turning off the word line WL4 and transistor Q4. Subsequently, the bit lines BL and $\overline{BL}$ are again precharged at the time point t2, then the control signal line RL3 is turned on, and the sense amplifier SA is operated at the time point t1. At this time, the bit lines BL and $\overline{BL}$ are set at a rewriting potential corresponding to the data registered in the third element REG3. When the word line WL3 is turned off in this state, the transistor Q3 is accordingly turned off, thereby performing rewriting in the capacitor C3. In a similar way, rewriting is performed successively in the capacitors C2 and C1.

Writing in the DRAM shown in FIG. 3 can be performed by setting data required for the bit lines BL and $\overline{BL}$, by means of a data-writing circuit (not shown) at the same time point as that of rewriting. Each column portion of the memory cell array is selectively connected to a data input/output circuit (not shown) by means of the input/output lines I/O and $\overline{I/O}$, to write input data, and to transfer read out data to the output side. The input/output lines I/O and $\overline{I/O}$ each may be used as an input/output line, or may be used as a dedicated input or output line.

As is described above, since the DRAM of FIG. 3 employs a cascade gate type memory cell array, it can have a density much higher than the conventional DRAM employing one transistor/one capacitor type memory cell array, thereby remarkably reducing the cost of each bit. Thus, it is very advantageous to use the cascade gate type memory cell array of FIG. 3, so as to produce a large capacity DRAM, which is used in place of such a recording medium as a magnetic disk, at low cost by means of the conventional technique.

In this connection, it should be noted that each memory cell of the DRAM of FIG. 3 is accessed in a serial manner (i.e., data is serially written into or read out of each memory cell), so that its random accessibility is limited to some extent, and also the required access time is inevitably a little long. However, these disadvantages can be removed by performing serial-to-parallel or parallel-to-serial conversion of 4-bit data, thereby obtaining complete random accessibility as a DRAM capable of writing in and reading out data in units of 4 bits. Further, if the DRAM of FIG. 3 is modified to save power such that the memory cell array comprises a plurality of sub-arrays, and also that only some parts (e.g. two or four) of the sub-arrays are simultaneously activated, it can serve as a DRAM capable of writing in and reading out data in units of 8 or 16 bits by means of serial-to-parallel or parallel-to-serial conversion.

Moreover, to random access only the required data by using no serial-to-parallel conversion, it is not always needed to access all the capacitor of a memory cell, but it suffices if a capacitor storing the data required and a capacitor or capacitors (if exist) located closer to the node than the former are accessed. In this case, the access time varies in accordance with the distance between the node (bit line) and a capacitor selected. For dealing with this, it is considered that (a) a maximum access time is determined as the access time, or alternatively that (b) a waiting signal is being generated until the read-out data is output from the DRAM.

Further, it should be noted that some conventional DRAMs have a 4-bit serial access function such as a nibble mode, and that there have been rapidly increased applications such as block transfer between a cache memory and a DRAM or image data processing and storage, to which a serial access method can be applied. Accordingly, the DRAM of the invention may keep a serial access function since a slight limitation to its random accessibility does not so adversely act upon the actual operation. Thus, the DRAM of the invention can be estimated in spite of its serial access function by virtue of the above-described advantage that it can have high density.

In addition, although each register element is turned off at the time point shown in FIG. 9 after it is turned on again by a signal supplied through the corresponding control signal line RL1-RL3, thereby terminating the writing, it may be turned off after the bit lines are precharged. However, in a case where accurate data need be kept registered in the register even after it is stored in the memory cell, it is desirable that the register is turned off at the timing shown in FIG. 9. Referring more strictly, the first turn-on of the register element is not necessarily performed at the time point shown in FIG. 9, after registering data read out of the capacitor, but the element may be turned on earlier than the timing shown in FIG. 9, if the data is assuredly registered therein.

Moreover, by setting such that the remoter from the read-out node the capacitors C1–C4 of the memory cell MCi are located, the larger capacitance they have, that gradual reduction in the voltage variation of the read-out/write-in node which occurs while the capacitors are successively accessed will be compensated, so that the voltage variation of the node will have substantially the same value when any of the capacitors is accessed, thereby preventing data from being erroneously read out.

If the register REG in FIG. 3 comprises four (equal to the number of the capacitors of the memory cell MCi) register elements, data items stored in the four capacitors are to be registered in the four register elements, respectively.

FIG. 10 shows one-column portion of the memory cell array of a DRAM according to a second embodiment of the invention. This memory cell array consists of a plurality of cascade gate type memory cells as shown in FIG. 2.

Each memory cell MCi (i=0, 1, . . . ) in FIG. 10 consists of a cascade gate having (more than three) MOS transistors Q1–Q5 connected to one another by cascade connection and connected between first and second nodes N1 and N2, and capacitors C1–C4 for storing data each connected to a corresponding connecting node connecting adjacent two transistors. The first and second read-out/write-in nodes N1 and N2 are connected to one bit line BL. The transistors Q1–Q5 of the memory cell MC0 have gates connected to word lines WL10–WL50, respectively. The word lines WL10–WL50 are also connected to corresponding transistors Q1–Q5 of each of memory cells (not shown) arranged in the same row as the memory cell MC0. Similarly, the transistors Q1–Q5 of the memory cell MC1 have gates connected to word lines WL11–WL51, respectively, and the word lines WL11–WL51 are also connected to corresponding transistors Q1–Q5 of each of memory cells (not shown) arranged in the same row as the memory cell MC1.

The register REG shown in FIG. 10 has four (equal to the number of the capacitors of the memory cell MCi) register elements REG1–REG4, which have gates connected to control signal lines RL1–RL4, respectively.

Figure 11:
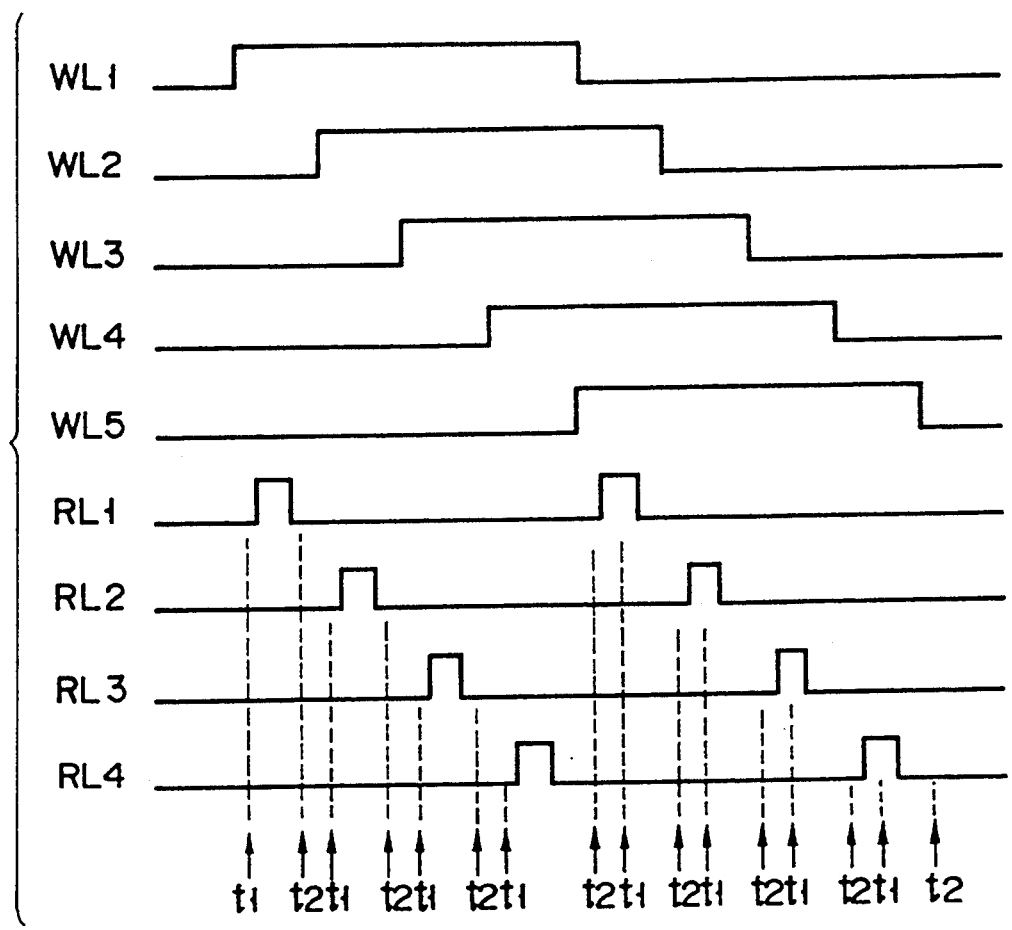
FIG. 11 is a waveform timing chart illustrating the operation of the DRAM shown in FIG. 10.

FIG. 11 is a waveform timing chart showing the operations of the sense amplifier SA, register REG, and word lines WL1–WL5, which are connected to each memory cell MCi in FIG. 10. In the figure, time points t1 and t2 correspond to those shown in FIG. 9. As is evident from FIG. 11, the DRAM of FIG. 10 operates in a way similar to the DRAM of FIG. 3, and therefore its operation is not explained in detail. Thus, it is possible to successively read data items to the bit line BL from the capacitors C1–C4 in the order mentioned, also at the same time to successively and temporarily store them in the register REG, and thereafter to successively write the data from the bit line BL to the capacitors C1–C4 in the order mentioned. If the transistors Q1–Q5 and register elements REG1–REG4 are turned on and off in the order reverse to the first-mentioned case, it is possible to successively read data items to the bit line BL from the capacitors C4–C1 in the order mentioned, i.e., in the order from the capacitor closest to the second node N2 to that furthest therefrom, also at the same time to successively and temporarily store them in the register REG, and thereafter to successively write the data from the bit line BL to the capacitors C4–C1 in the order mentioned, i.e., in the order from the capacitor closest to the second node N2.

In the above-described embodiments, a complex memory including a cache memory can be employed by making the register REG consist of four SRAM cells serving as the cache memory. In this case, the cache memory greatly compensates the disadvantage of the memory cells MCi that they are serially accessed.

Figure 12:
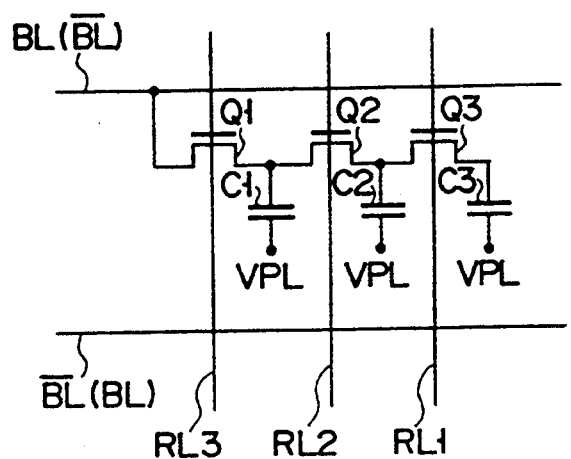
FIG. 12 is a circuit diagram showing another register incorporated in the invention.

FIG. 12 shows another example of the register REG, in which the transistors Q1–Q3 are connected to capacitors C1–C3 in a manner similar to the memory cell shown in FIG. 1, and the gates of the transistors Q1–Q3 are connected to control signal lines RL3–RL1, respectively.

Figure 13:
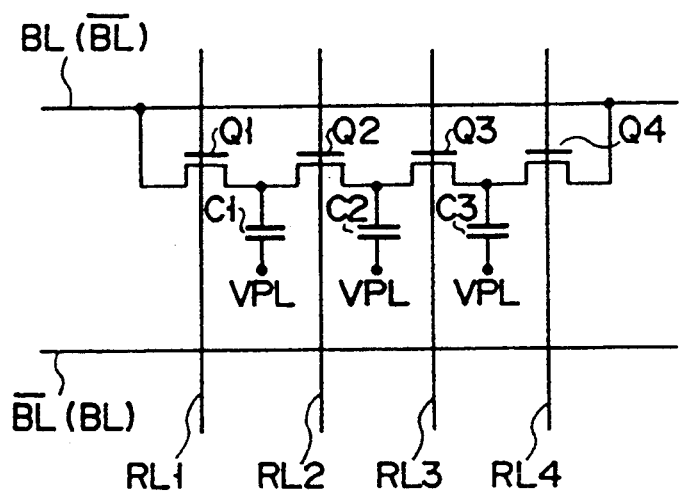
FIG. 13 is a circuit diagram showing a further register incorporated in the invention.

FIG. 13 illustrates a further example of the register REG, in which the transistors Q1–Q4 are connected to capacitors C1–C3 in a manner similar to the memory cell shown in FIG. 2, and the gates of the transistors Q1–Q4 are connected to control signal lines RL1–RL4, respectively.

Figure 14:
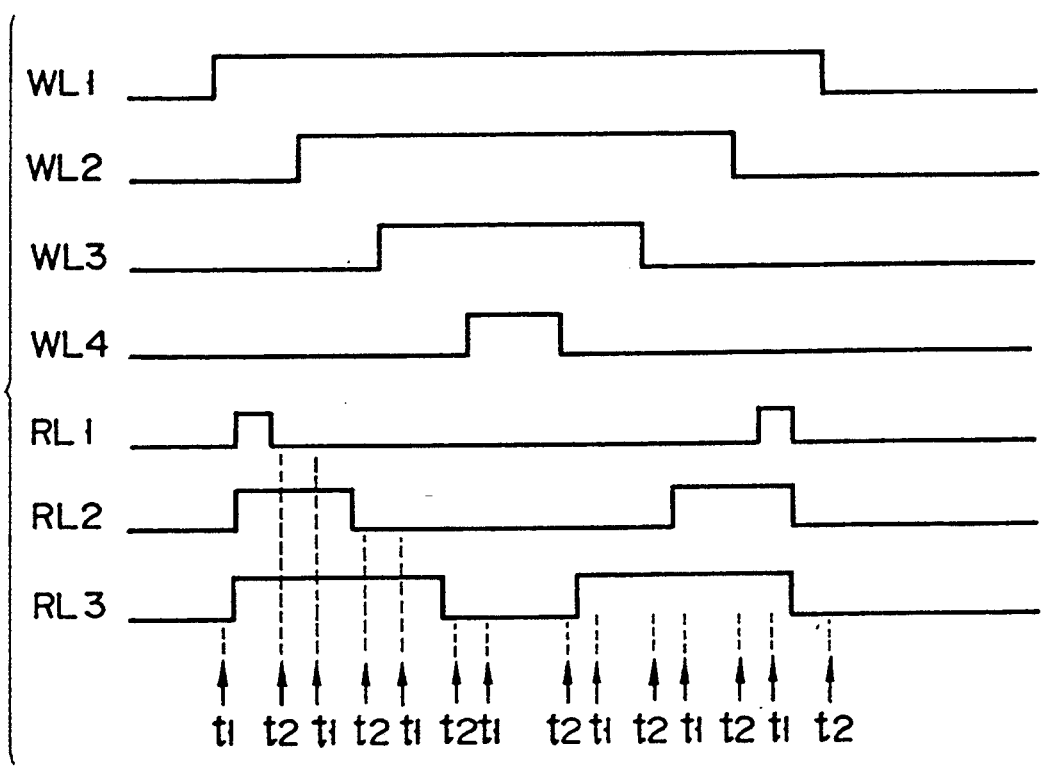
FIG. 14 is a waveform timing chart illustrating the operation of a DRAM according to a third embodiment of the invention.

FIG. 14 illustrates the operation of a DRAM according to a third embodiment of the invention in which the memory cell shown in FIG. 1 and the register shown in FIG. 12 are incorporated. In FIG. 14, time points t1 and t2 correspond to those shown in FIG. 9.

In the embodiments in which the sense amplifier SA is operated at the time point t1, if charging and discharging occur in the bit lines BL and $\overline{BL}$ during operation of the sense amplifier SA, the potential of the bit lines varies between the highest and lowest values of the power source at least seven times during reading data out of each memory cell MC, thereby increasing power consumption. A DRAM which can operate with small power consumption is shown in FIG. 15.

FIG. 15 illustrates a part of one-column portion of the memory cell array of a DRAM according to a fourth embodiment. In the DRAM, a pair of transfer gates (MOS transistors) TG are connected between the sense amplifier SA and bit lines BL and $\overline{BL}$. Reference symbols DL and $\overline{DL}$ denote digit lines which are parts of the bit lines, respectively. To successively read data items from the capacitors of a selected memory cell MCi, and then to store them, the transfer gates TG are operated as follows:

After the data items are transmitted from the capacitors to the sense amplifier SA, the transfer gates TG are turned off, thereby operating the sense amplifier SA. To rewrite (or write) data, the transfer gates TG are turned on, thereby making the sense amplifier SA charge and discharge the bit lines BL and $\overline{BL}$. Thus, the transfer gates are charged and discharged only at the time of rewriting (or writing), i.e., totally only four times, which reduces the power consumption.

Any of the above-described embodiments may be modified such that a differential type amplifier which compares the potential of the bit line with a reference potential is used as the sense amplifier SA, thereby setting the rewriting potential of the bit line by a data writing circuit (not shown) in accordance with the output of the amplifier.

The DRAMs of the invention can incorporate not only cascade gate type memory cells, but also semiconductor memory cells proposed by the inventor of the invention in U.S. application Ser. No. 6 8 7, 6 8 7.

Specifically, the capacitors C1–C4 of the cascade gate type memory cell MCi each may have the other end supplied with an external power voltage vcc or an external ground voltage Vss.

Further, a memory cell, to which a technique of operating its capacitor plate in synchronism with a clock signal is applied, may be used in place of the above-described memory cell MCi. This technique is disclosed in IEEE JOURNAL OF SOLID-STATE CIRCUITS, VOL. SC-17, NO. 5, p. 872 October 1982, "A Storage-Node-Boosted RAM with Word-Line Delay Compensation" by K. Fujishima et al.

Alternatively, a memory cell, to which a technique of connecting a transfer gate to the both opposite ends of each capacitor is applied, may be used in place of the memory cell MCi. This technique cell is disclosed in "A Novel Memory Cell Architecture for High-Density DRAMs" (FIG. 1b) by Y. Ohta, et al., 1989 Symposium of VLSI Circuits, Digest of Technical Papers, pp. 101–102.

Although the above-described embodiments are constructed such that the register REG temporarily stores the data read out of the memory cell MCi in a time series manner, there may alternatively be provided bit line sense amplifiers of a number equal to the number of the capacitors of each memory cell, which amplifiers also serve as register means. An example of this case is illustrated in FIG. 16 as a fifth embodiment.

FIG. 16 shows part of one-column portion of the memory array of a DRAM according to the fifth embodiment. As is shown in the figure, a pair of transfer gates TG are connected between each of sense amplifiers SA1–SA4 and the bit lines BL and $\overline{BL}$, respectively, and are turned on and off by signals supplied through control signal lines $\Phi$ 1–$\Phi$ 4.

FIG. 17 is a waveform timing chart showing the operations of the sense amplifiers SA1–SA4, and word lines WL1–WL4, which are connected to one memory cell MCi, in the case of using a cascade gate type memory cell as shown in FIG. 1, as the memory cell MC of the DRAM of FIG. 16. Time points t1 and t2 in the figure correspond to those shown in FIG. 9.

When the control signal line $\Phi$ 1 is turned on, and the word line WL1 is turned on in a state where the bit lines BL and $\overline{BL}$ and sense amplifier SA1 are precharged, the data stored in the capacitor C1 of the memory cell MCi is transmitted to the sense amplifier SA1. Then, the control signal line $\Phi$ 1 is turned off, and then the sense amplifier SA1 is operated, thereby amplifying and latching the data read out of the capacitor C1. Rewriting (or writing) is performed by precharging the bit lines BL and $\overline{BL}$, then selecting a sense amplifier, further charging or discharging the bit lines to a predetermined potential, and turning off a corresponding word line. If the sense amplifiers SA1–SA4 consisting of CMOS transistors are used, and also if the potential of the bit lines can be set to the power source potential Vcc and to the ground potential Vss, the precharging of the bit lines can be omitted at the time of rewriting or writing. Further, the sense amplifiers SA1–SA4 can serve as a cache memory by using them like a SRAM cell.

Figure 18:
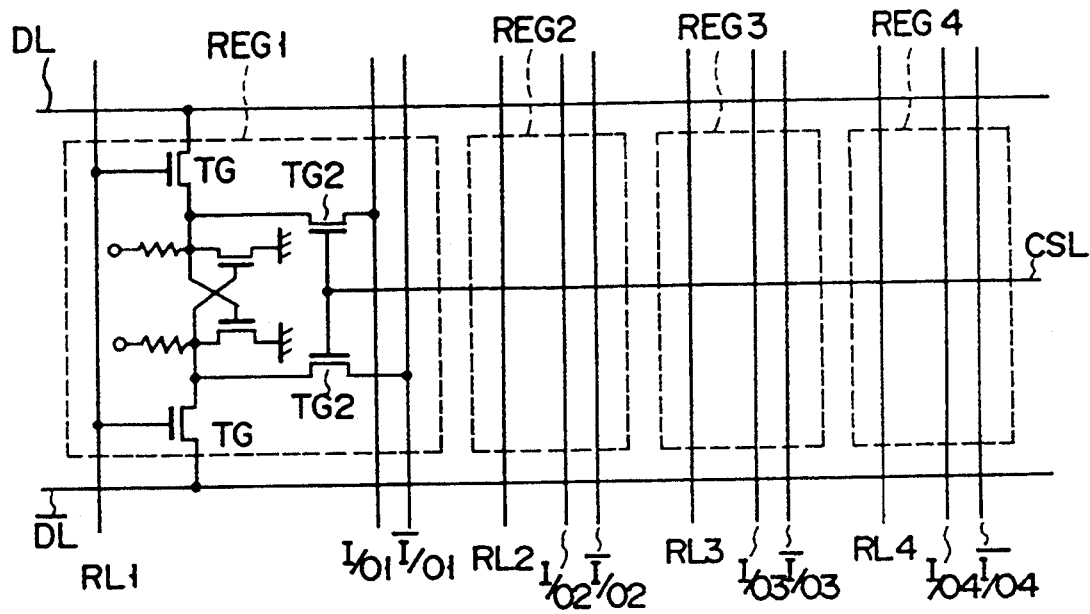
FIG. 18 is a circuit diagram showing a part of a DRAM of a sixth embodiment of the invention.

FIG. 18 shows part of one-column portion of the memory array of a DRAM according to a sixth embodiment. As is shown in the figure, the DRAM employs register elements REGi (i=1, 2, 3, and 4) each consisting of a SRAM, also transfer gates TG to be controlled by signals supplied through control signal lines RLi (i=1, 2, 3, and 4), two of which transfer gates are connected between each register element REGi and digit lines DL and $\overline{DL}$, respectively, and transfer gates TG2 to be controlled by signals supplied through column selection lines CSL, two of which transfer gates are connected between each register element REGi and input/output lines (I/O)i and $\overline{(I/O)i}$, respectively. 4-bit data items are read at a time from one-column portion of the memory array of the DRAM.

Figure 19:
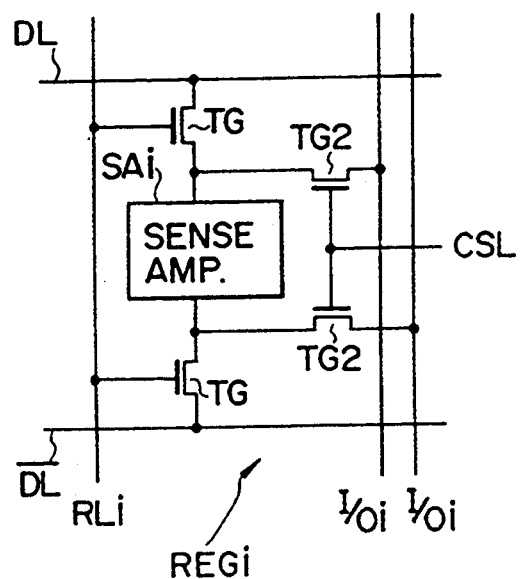
FIG. 19 is a circuit diagram showing another example of elements forming a register shown in FIG. 18.

FIG. 19 shows one register element REGi in the case of replacing the SRAM cell with a sense amplifier SAi.

In the above embodiments, the memory cell array has a folded bit line structure, it may have an open bit line structure.

Moreover, the invention may employ a so-called single end type sense amplifier having an input node connected to one bit line BL directly or by means of a transfer gate, etc, as is shown in FIGS. 20–24.

FIG. 20 illustrates a circuit obtained by modifying the circuit of FIG. 3 such that the sense amplifier employed therein is replaced with a single end type sense amplifier.

Figure 21:
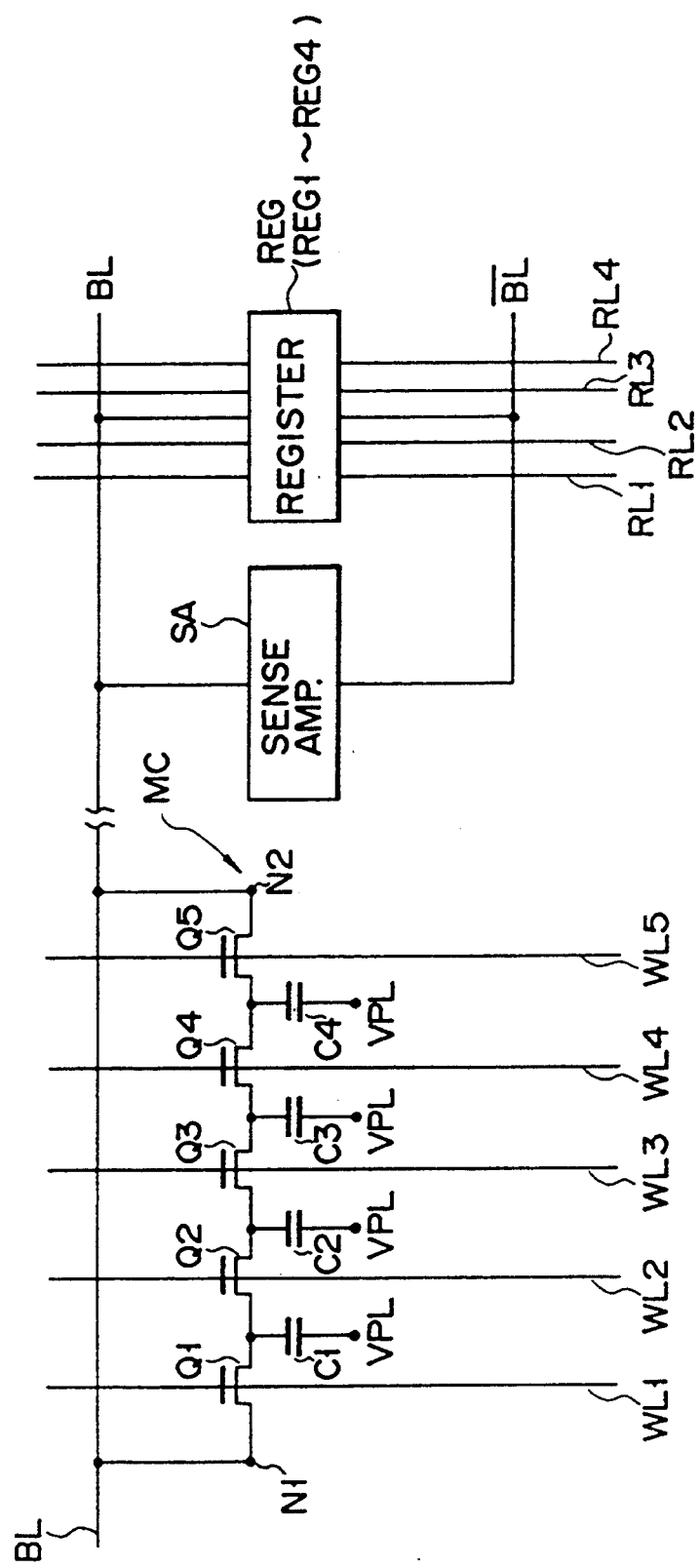
FIG. 21 is a diagram showing a circuit similar to that shown in FIG. 10, except that it incorporates a single end type sense amplifier.

FIG. 21 illustrates a circuit obtained by modifying the circuit of FIG. 10 such that the sense amplifier employed therein is replaced with a single end type sense amplifier.

Figure 22:
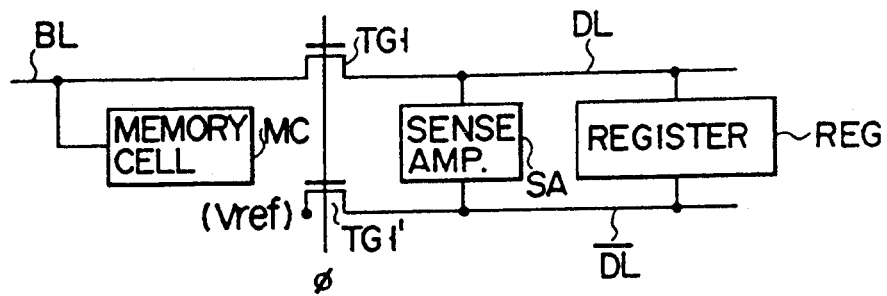
FIG. 22 is a diagram showing a circuit similar to that shown in FIG. 15, except that it incorporates a single end type sense amplifier.

FIG. 22 illustrates a circuit obtained by modifying the circuit of FIG. 15 such that the sense amplifier employed therein is replaced with a single end type sense amplifier. In this case, a transfer gate TG1' connected to one digit line $\overline{DL}$ may be removed since it is additionally provided only for preventing the circuit from being adversely affected by the transfer gate TG1 connected between the bit line BL and sense amplifier SA. Alternatively, the circuit may be modified such that a reference potential Vref is supplied to the sense amplifier through the transfer gate TG1'.

Figure 23:
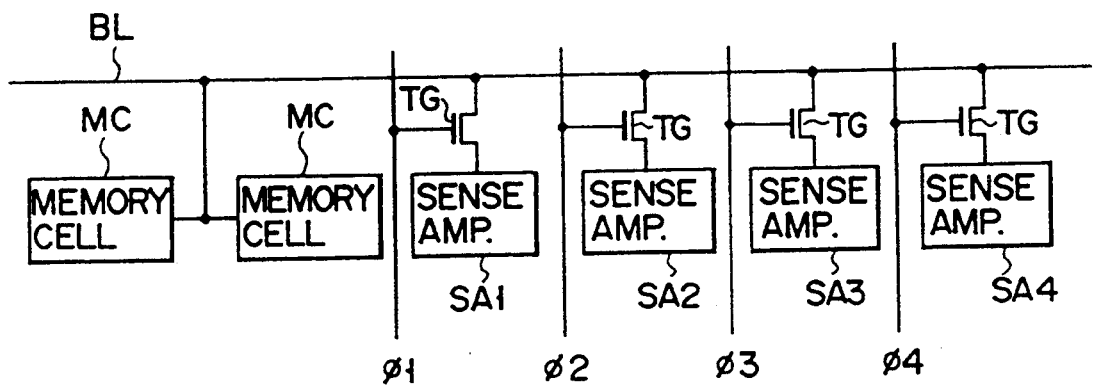
FIG. 23 is a diagram showing a circuit similar to that shown in FIG. 16, except that it incorporates a single end type sense amplifier.

FIG. 23 illustrates a circuit obtained by modifying the circuit of FIG. 16 such that the sense amplifier employed therein is replaced with a single end type sense amplifier.

Figure 24:
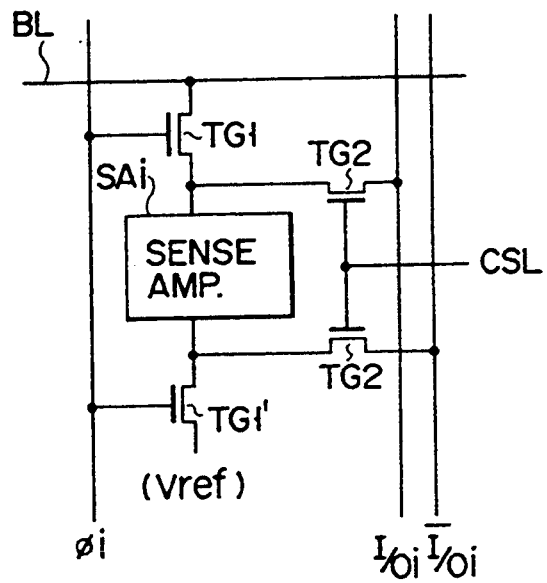
FIG. 24 is a diagram showing a circuit similar to that shown in FIG. 19, except that it incorporates a single end type sense amplifier.

FIG. 24 illustrates a circuit obtained by modifying the circuit of FIG. 19 such that the sense amplifier employed therein is replaced with a single end type sense amplifier. Here, a transfer gate TG' is similar to that shown in FIG. 22.

In addition, to connect the transfer gate between the bit line and sense amplifier, it is possible to employ a so-called shared sense amplifier technique. Specifically, in a case where a single type sense amplifier is used as the sense amplifier in the circuit, and the shared sense amplifier technique is applied thereto, the circuit may be constructed such that a plurality of bit lines and transfer gates are connected to one sense amplifier, and that one of the bit lines is selected by controlling the transfer gates to be connected to the sense amplifier. Further, in a case where a cell array of a folded bit line structure or open bit line structure is incorporated in the circuit, and the shared sense amplifier technique is applied thereto, the circuit may be constructed such that a plurality of pairs of bit lines and transfer gates are connected to one sense amplifier, and that one pair of the bit lines is selected by controlling the transfer gates to be connected to the sense amplifier.

The invention is not limited to the above-described embodiments, but may be modified without departing from the spirit and scope thereof.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor memory device comprising:
   a memory cell array having a plurality of dynamic memory cell units, each of the memory cell units of said memory cell array including
   a first MOS transistor having first and second terminals, said first terminal of said first MOS transistor connected to a read data node;
   a second MOS transistor having first and second terminals, said first terminal of said second MOS transistor connected to said second terminal of said first MOS transistor; and
   first and second data storage capacitors respectively connected to said second terminals of said first and second MOS transistors;
   word lines respectively connected to gates of said first and second MOS transistors for supplying signals to control ON/OFF switching of said first and second MOS transistors; and
   register means arranged in a column portion of said memory cell array, for registering the data read from said memory cell units in a corresponding column in a time series manner.

2. The semiconductor memory device according to claim 1, wherein said register means is a register having a number of register elements one less than the number of capacitors of each of said memory cell units.

3. The semiconductor memory device according to claim 2, wherein said register elements each comprise a static memory cell.

4. The semiconductor memory device according to claim 1, wherein said register means is a register having a number of register elements equal to the number of capacitors of each of said memory cell units.

5. The semiconductor memory device according to claim 4, wherein said register elements each comprise a static memory cell.

* * * * *